United States Patent
Beausoleil et al.

[11] Patent Number: 6,035,117
[45] Date of Patent: Mar. 7, 2000

[54] TIGHTLY COUPLED EMULATION PROCESSORS

[75] Inventors: William F. Beausoleil, Hopewell Junction, N.Y.; Roy G. Musselman, Rochester, Minn.; Tak-Kwong Ng, Hyde Park; Helmut Roth, Hopewell Junction, both of N.Y.

[73] Assignee: International Business Machines Corporation, Armonk, N.Y.

[21] Appl. No.: 09/052,732

[22] Filed: Mar. 31, 1998

[51] Int. Cl.[7] .................................................. G06F 9/455
[52] U.S. Cl. ......................................................... 395/500.46
[58] Field of Search ........................ 395/500.44, 500.45, 395/500.46, 500.47, 500.48

[56] References Cited

U.S. PATENT DOCUMENTS

| | | |
|---|---|---|
| 4,434,462 | 2/1984 | Guttag et al. . |
| 4,547,880 | 10/1985 | De Vita et al. ........................... 370/362 |
| 5,551,013 | 8/1996 | Beausoleil et al. . |
| 5,557,217 | 9/1996 | Pedersen . |
| 5,566,344 | 10/1996 | Hall et al. . |
| 5,604,888 | 2/1997 | Kiani-Shabestari et al. ...... 395/500.44 |
| 5,649,167 | 7/1997 | Chen et al. .......................... 395/500.44 |
| 5,857,090 | 1/1999 | Davis et al. ......................... 395/500.46 |

OTHER PUBLICATIONS

M. Hamdi, "A Class of Recursive Interconnection Networks: Architectural Characteristics and Hardware Costs", IEEE Transactions on Cicuits and Systems–I: Fundamental Theory and Applications, vol. 41, No. 12, Dec. 1994, pp. 805–816.

Quickturn CoBALT Emulation System Brochure, Quickturn Design Systems, Inc., Copyright May 1997.

*Primary Examiner*—Kevin J. Teska
*Assistant Examiner*—Russell W. Frejd
*Attorney, Agent, or Firm*—Lawrence D. Cutter; Lynn L. Augspurger

[57] ABSTRACT

In an emulation system, the emulation processors are grouped in clusters which are capable of interchanging information between both input memory stacks and data memory stacks associated with each of the processor elements. This capability significantly enhances the performance of emulation engines and, in particular, it provides a mechanism for emulation of memory array elements in computer systems in a more efficient and faster manner.

1 Claim, 3 Drawing Sheets

TIGHTLY COUPLED EMULATION PROCESSORS

BACKGROUND OF THE INVENTION

The present invention is generally directed to the architecture and construction of machines which emulate electronic circuits. More particularly, the present invention is directed to an emulation engine in which individual emulation processor modules are configured in distinct clusters having associated input and output memory arrays which are coupled to one another even though they are in different clusters. These emulation processor modules are organized with this memory in a fashion which solves problems associated with circuit density and input/output (I/O) pin limitations.

The necessity and usefulness of emulation devices has increased enormously with growth in the complexity of integrated circuits. Basically, an emulation engine operates to mimic the logical design of a set of one or more integrated circuit chips. The emulation of these chips in terms of their logical design is highly desirable for several reasons which are discussed in more detail below. It is, however, noted that the utilization of emulation engines has also grown up with and around the corresponding utilization of design automation tools for the construction and design of integrated circuit chip devices. In particular, as part of the input for the design automation process, logic descriptions of the desired circuit chip functions are provided. The existence of such software tools for processing these descriptions in the design process is well mated to the utilization of emulation engines which are electrically configured to duplicate the same logic function that is provided by a design automation tool.

Utilization of emulation devices permits testing and verification, via actual electrical circuits, of logic designs before these designs are committed to a so-called "silicon foundry" for manufacture. The input to such foundries is the functional logic description required for the chip, and its output is initially a set of photolithographic masks which are then used in the manufacture of the desired electrical circuit chip device. However, it is noted that the construction of such masks and the initial production of circuit chips, which operate in accordance with the designed-for functional logic requirements, is expensive. Any passage of a given device having the prescribed logic functionality through such a foundry is an expensive and time consuming process which clearly should be undertaken only once. It is the purpose of emulation engines to ensure such a single passage from the functional logic design stage through to the stage of chip production via such a foundry.

Verifying that logic designs are correct in the early stage of chip manufacturing, therefore, is seen to eliminate the need for costly and time-consuming second passes through a silicon foundry. Emulation, therefore, provides two very significant advantages. Firstly, the proper verification of a functional logic design eliminates the need for a second costly passage through the foundry and, secondly, and just as importantly, getting the design "right the first time" means that the design does not have to be corrected in the foundry, and accordingly, production delays are therefore significantly reduced and the time to market for the particular technology and technological improvements embedded in the integrated circuit chip is greatly reduced, thus positively impacting the ability to deliver the most sophisticated of technological solutions to consumers in as short a time as possible.

An additional advantage that emulation systems have is that they act as a functioning system of electrical circuits which makes possible the early validation of software which is meant to operate the system that the emulator is mimicking. Thus, software can be designed, evaluated and tested well before the time when the system is embodied in actual circuit chips. Additionally, emulation systems can also operate as simulator-accelerator devices thus providing a high-speed simulation platform.

Emulation engines generally contain an interconnected array of emulation processors (EP). Each emulation processor (hereinafter, also sometimes simply referred to as "processor") is programmed to evaluate a particular logic function (for example, AND, OR, XOR, NOT, NOR, NAND, etc.). The programmed processors, together as a connected unit, emulate the entire desired logic design. However, as integrated circuit designs grow in size, more emulation processors are required to accomplish the emulation task. The aim of the present invention is therefore to increase the capacity of emulation engines in order to meet the increasingly difficult task of emulating more complex circuits and logic functions. In particular, one method of achieving this is by increasing the number of emulation processors in each of its modules.

In particular, the present invention represents an improvement on an existing emulation engine referred to as the ET3.5 Model. Also, in particular, the improved model is described herein and is referred to as the ET3.7 Model.

In an emulation engine in which there are a plurality K of emulation processors, the ideal situation is to have each processor be capable of connection to any one of the other K−1 processors. However, as the number of emulation processors K increases, the total number of processor-to-processor connections increases approximately as the second power of K. In particular, a fully connected network of K processors requires K(K−1) processor-to-processor connections. In such a fully connected network, each processor has K−1 connections to the other processors. However, physical constraints, such as connector size and/or pin size, make it completely impractical to construct fully connected networks when the number K of processors is large. For example, a fully populated ET3.5 emulation engine contains 33,280 processors. To keep the interprocessor wiring practical in a device such as the ET3.5, the processors are clustered hierarchically. In particular, an ET3.5 system, as designed, can contain from 1 to 8 circuit boards; each circuit board contains 65 modules; and each module contains 64 emulation processors. The processor array within each module is fully connected. However, each module has only a single connection to each one of the other modules on the same board. Similarly, each board has only a relatively small number of connections to other boards in the system.

Emulation processors can be added to an emulation engine such as the ET3.5 at any level in the hierarchy (engine, board, or module). However, processor addition at each level has an associated penalty. For example, adding a second ET3.5 engine doubles the capacity and the cost, but processor-to-processor connectivity grows by a factor of four and is furthermore limited by engine-to-engine cabling. Adding new boards to an ET3.5 emulation engine requires, furthermore, an updating of the technology, the power supply and the cooling systems as well as a rework of the physical packaging into different frames and/or cages. Putting more modules onto each board is impractical since boards in the existing ET3.5 technology are already stretching currently available technology in terms of board size, the number of board layers and the number of nets present on the board. As a result of these limitations, the improvements provided by the present invention are directed to systems in which more emulation processors are fit into the same physical area in an emulation chip module.

However, simply increasing the number of emulation processors and their associated input and output memory stacks is not by itself a sufficient solution to the problem since, with every doubling of the number of emulation processors, there is a correspondingly significantly large increase in the number of input/output pins required to accommodate the processors on any given chip die. However, existing systems are already at their essential pinout limit in terms of pin size and pin spacing for the purpose of moving signals to and from the module. Thus, a four-fold increase in the number of processors would require a corresponding four-fold increase in the number of I/O pins for each module. In addition, an increase in the number of processors and their associated memory stacks also means a growth in the number of possible interconnections that are desired. Unfortunately, the number of interconnections grows as the square of the number of units (memories or processors) that are to be interconnected. This would, in turn, require major changes to the emulation boards. However, changing these emulation boards is very expensive. And furthermore, the circuit boards, as noted, are already the most advanced printed circuit boards that current technology can provide. Additionally, a four-fold increase in the number of processors would normally mean a sixteen-fold increase in the number of processor-to-processor interconnections.

For purposes of better understanding the structure and operation of emulation devices, U.S. Pat. No. 5,551,013 is hereby incorporated herein by reference.

SUMMARY OF THE INVENTION

In accordance with a preferred embodiment of the present invention, the input stack and data stack in an emulation processor, such as is described in aforementioned U.S. Pat. No. 5,551,013, is provided with direct-out connections which add a fourth read location to the memory stacks in each processor. The value read from this fourth location is immediately available to any of the other three processors in a firmly coupled cluster. Accordingly, the present invention groups processor elements in clusters in which input stack and data stack values are available to other processors in the cluster via a switching circuit which interconnects output from input memory in one cluster to emulation processors in at least one of the other processors in the cluster. This is preferably provided for both input stack and data stack interconnections.

Accordingly, it is an object of the present invention to provide circuit emulation devices having increased capacities.

It is also an object of the present invention to provide faster and more flexible circuit and system emulation capabilities.

It is also an object of the present invention to eliminate multiple passes through silicon foundry design cycles.

It is also an object of the present invention to provide flexibility in emulation apparatus architecture.

It is also an object of the present invention to provide greater interconnectivity between emulation processors particularly with respect to input stack and data stack operations.

It is yet another object of the present invention to group emulation processors present within a module into clusters in which emulation memory function is expanded, more flexible and significantly more coupled within the emulation processor cluster.

It is also an object of the present invention to provide an emulation system in which memory is emulated in a fashion in which addresses are distributed over dedicated connections among processors in a cluster.

It is still another object of the present invention to reduce the number of processor steps required for memory operations and to thereby increase the speed of emulation.

It is a still further object of the present invention to improve emulation processor utilization.

Lastly, but not limited hereto, it is an object of the present invention to provide an architecture for emulation systems which is capable of growth and expansion, particularly at the module level.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1A:
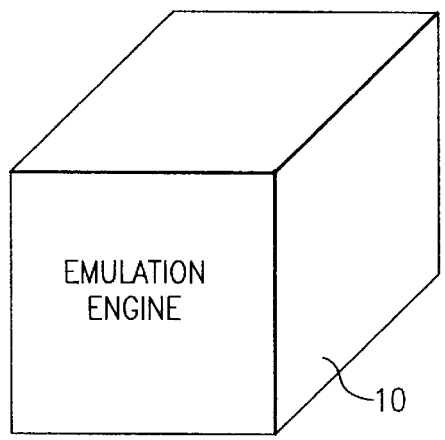
FIGS. 1A–1D illustrate, in sequentially greater detail, the hierarchical architecture of an emulation engine, in functional block diagram form.
Figure 1B:
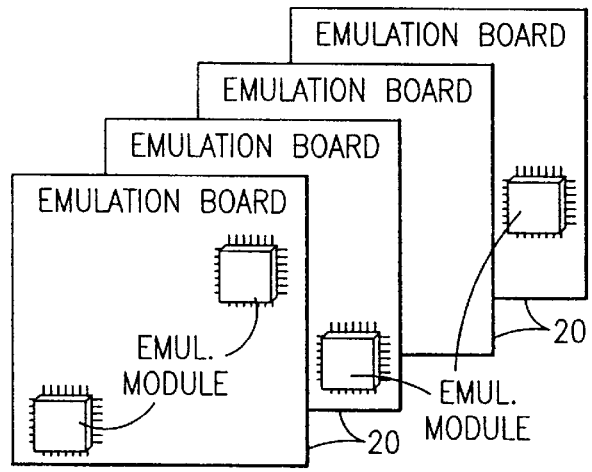
Figure 1C:
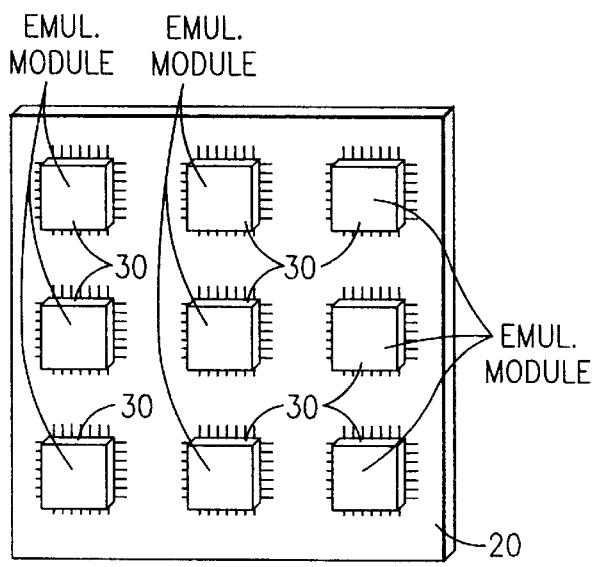
Figure 1D:
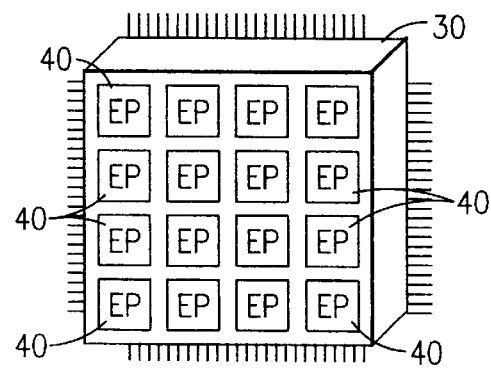

FIG. 1A illustrates, in functional block form, the highest hierarchical level for emulation engine 10. Emulation engine 10 includes a plurality of emulation boards 20, as shown in FIG. 1B. In turn, emulation boards 20 include a plurality of emulation modules 30. Emulation modules 30 comprise individual circuit chip components whose pinout spacing and pin numbers must be considered in the architecture of such engines. It is furthermore noted that each emulation module 30 includes a plurality of emulation processors 40. As described above, each emulation processor 40 is programmed to evaluate a particular logic function.

Figure 2A:
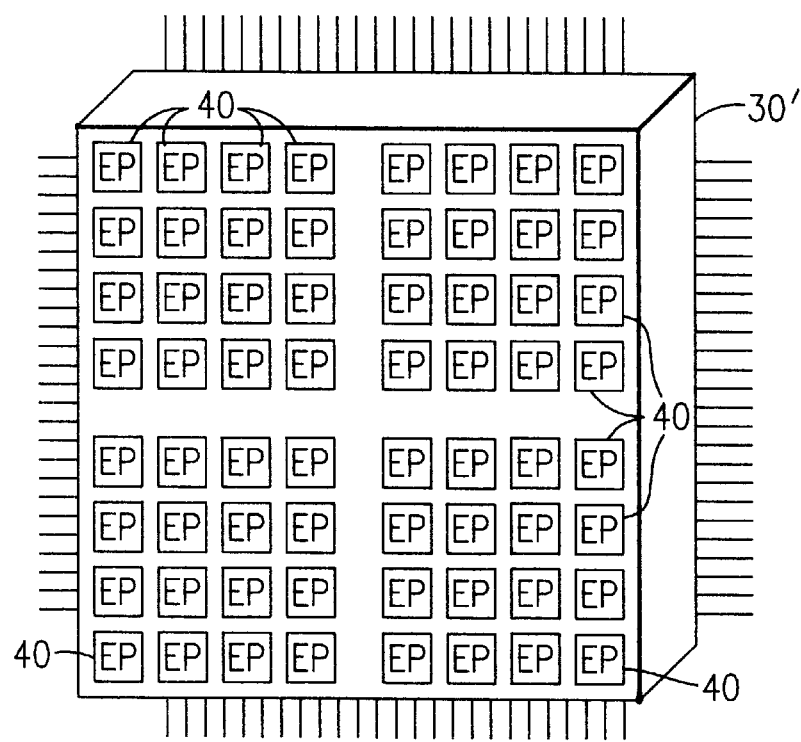
FIGS. 2A and 2B illustrate the pinout problem associated with a four-fold increase in the number of emulation processors per module.
Figure 2B:
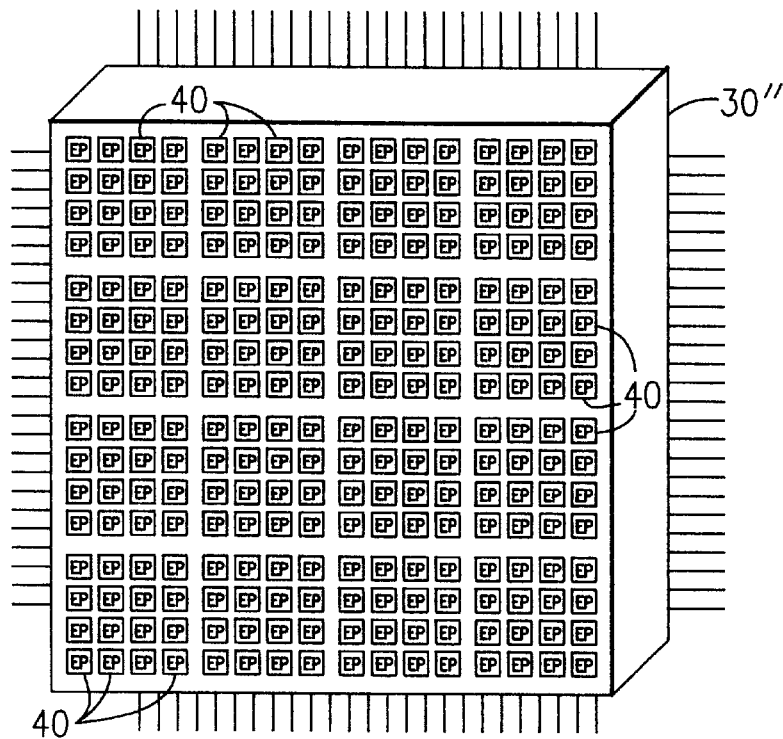

As the technology of circuit chip design advances, the number of emulation processors that are present on a given module increases. For example, FIG. 2A illustrates an emulation module 30' which includes 64 emulation processors 40. With advances in circuit design and packaging, the number of emulation processors is now increased to 256 processors per module. Certainly increasing the number of processors per module is advantageous in terms of increasing the power and flexibility of an emulation engine; however, increasing the processor packaging density does not change the limited input/output pin spacing as is suggested in a comparison of FIGS. 2A and 2B. In point of fact, the interprocessor connection problem grows significantly worse with an increase in circuit packaging density. For example, if one increases the number of emulation processors per module by a factor of 4, it soon becomes apparent that the I/O pin requirements are increased by the same factor so as to reach a degree which makes it impossible to have enough space for getting signals off and onto the module. Accordingly, it is therefore seen that it is highly desirable to provide as much interconnection capability between emulation processors on or within a single module as is possible.

Figure 3:
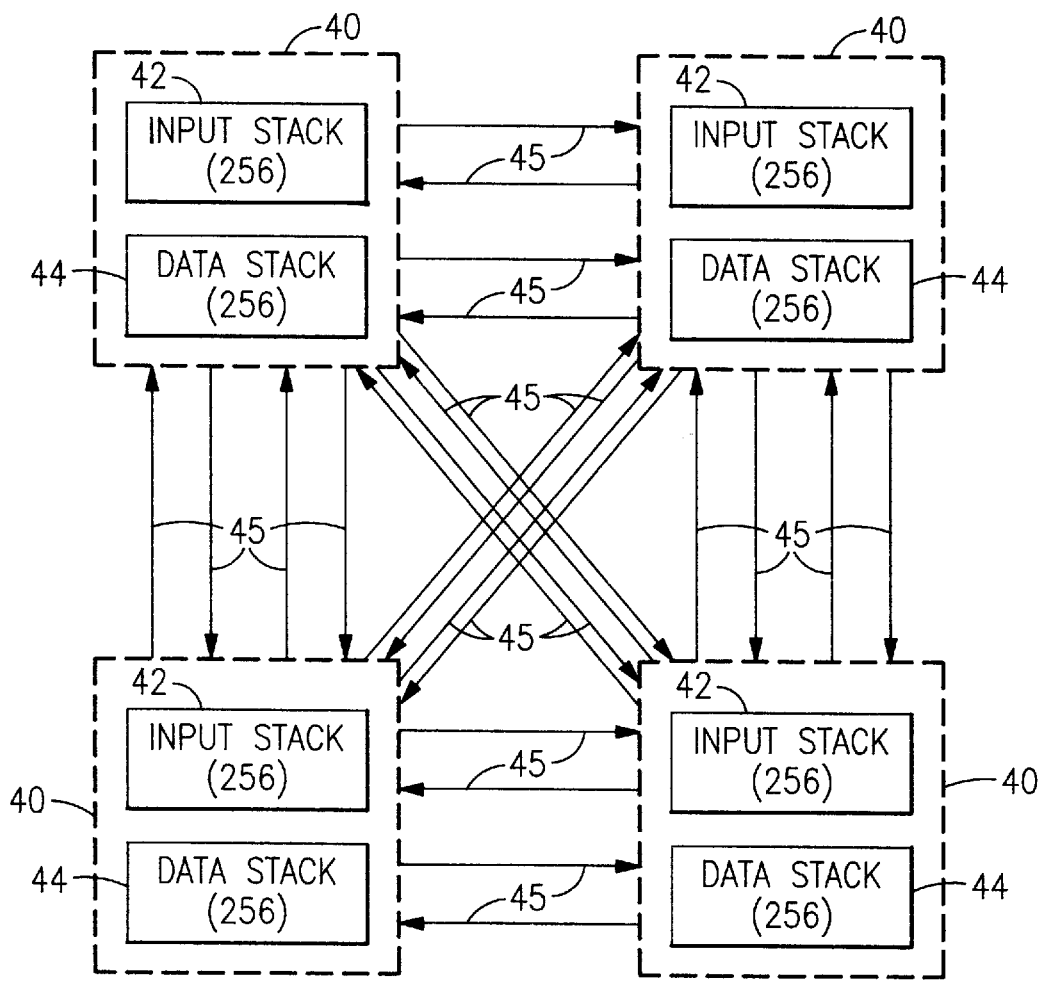
FIG. 3 illustrates, in functional block diagram form, the direct-out interconnection between emulation processors within a single cluster of four processors.

Accordingly, in accordance with the present invention, each input stack and each data stack connected to individual emulation processor elements as shown in FIG. 1 of the patent incorporated herein is provided with an additional direct-out connection to other emulation processors within a cluster. In particular, FIG. 3 illustrates a cluster of four emulation processors 40 which are coupled together in a tightly coupled system via their input stack 42 and data stack 44 memory elements. Signal flow arrows 45 represent a switching mechanism which permits interconnection of each input memory stack 42 and each data memory stack 45 with their counterpart memory elements in emulation processors within the same cluster. While there is shown here a cluster of four emulation processors, there is no conceptual limit on the number of emulation processors in a cluster. However, as is well understood, the complexity of interconnection increases with the number of processors in a cluster. FIG. 3 illustrates what is referred to herein as a "firmly coupled cluster." Each cluster consists of four processors. Each processor in a cluster can both send and receive a bit from either stack from any other processor in the cluster. This means that direct-out capabilities add four connections between each pair of processors in each cluster.

In particular, it is noted that in memory mode, several processors on a module are combined to form a memory address register (MAR) where the processors are in the same quadrant. When more than 16 processors on a module are used to emulate a memory array, the addresses from the MAR must fan out to other processor quadrants. In earlier designs, the addresses had to be sent out one bit per processor step. In the present design, however, it is noted that processors are combined to form the global MAR. However, now addresses are distributed over dedicated connections from multiple processors. This greatly reduces the number of processor steps required for memory operations, and thereby increases the speed of the emulation. This also improves processor utilization.

In the discussion above, it is noted that the notion of a cluster and the notion of a quadrant are not the same. In the examples presented herein, clusters contain four emulation processors. In contrast, the concept of a quadrant which is different is more particularly illustrated in FIG. 2A and FIG. 2B, FIG. 2A being slightly more suggestive of the organization of the emulation processors into two quadrants.

With specific reference to FIG. 3, it is noted that signal flow arrows 45 collectively illustrate the inclusion of interconnection means for linking the output from input stacks 42 to other emulation processors in the cluster. The same is also true for the linking of data stack structures. Additionally, it is noted that FIG. 3 also illustrates that each stack in currently preferred embodiments of the present invention is organized in a 1 by 256 bit fashion. These memory stack elements also store one bit per cell.

Accordingly, from the above, it should be appreciated that the tightly coupled cluster configuration and the associated interconnection of data and input memory stack elements provide significantly more flexible emulation capabilities. It is furthermore seen that the structure arrangement and architecture of the present invention satisfies all of the objects set forth above.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An emulation module comprising:

a plurality N of clusters of emulation processors in said module, each one emulation processor of said emulation processors in said module having an input stack memory and an data stack memory, and having means for interconnecting said one emulation processor to other emulation processors of said module to physically couple four or more emulation processors together in a firmly coupled system via their respective input stack memory and data stack memory as distinct clusters in said module;

said interconnecting means providing four read locations for said input stack memory and said output stack memory of each one emulation processor to provide each emulation processor with direct-out connections to the other processors of said physically coupled four or more emulation processors of a distinct firmly coupled cluster in said module whereby a value read from a fourth read location to the memory stacks in each processor is immediately available to any of the other three or more processors in a coupled cluster, and wherein each emulation processor in a cluster can both send and receive a bit from either the input stack memory or the data stack memory of any other processor in said firmly coupled cluster;

a switching circuit mechanism for interconnection of output from said input stack memory in one cluster to emulation processors in at least one of (N−1) other clusters; and said switching circuit mechanism also enabling interconnection of output from said data stack memory in one cluster to emulation processors in at least one of (N−1) other clusters.

* * * * *